United States Patent
Pillarisetty et al.

(10) Patent No.: US 8,941,128 B2
(45) Date of Patent: Jan. 27, 2015

(54) PASSIVATION LAYER FOR FLEXIBLE DISPLAY

(71) Applicants: Ravi Pillarisetty, Portland, OR (US); Sairam Agraharam, Chandler, AZ (US); John S. Guzek, Chandler, AZ (US); Christopher J. Jezewski, Hillsboro, OR (US)

(72) Inventors: Ravi Pillarisetty, Portland, OR (US); Sairam Agraharam, Chandler, AZ (US); John S. Guzek, Chandler, AZ (US); Christopher J. Jezewski, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/684,100

(22) Filed: Nov. 21, 2012

(65) Prior Publication Data
US 2014/0138713 A1    May 22, 2014

(51) Int. Cl.
| | | |
|---|---|---|
| *H01L 29/18* | (2006.01) | |
| *H01L 33/00* | (2010.01) | |
| *H01L 29/04* | (2006.01) | |
| *H01L 29/10* | (2006.01) | |
| *H01L 31/036* | (2006.01) | |
| *H01L 31/0376* | (2006.01) | |
| *H01L 31/20* | (2006.01) | |
| *H01L 29/15* | (2006.01) | |
| *H01L 31/062* | (2012.01) | |
| *H01L 31/113* | (2006.01) | |
| *H01L 33/44* | (2010.01) | |
| *H01L 33/48* | (2010.01) | |

(52) U.S. Cl.
CPC ............... *H01L 33/44* (2013.01); *H01L 33/48* (2013.01)

USPC ................. 257/88; 257/59; 257/72; 257/291; 257/E33.001; 257/E33.056; 257/E33.058

(58) Field of Classification Search
CPC ............ H01L 23/4985; H01L 51/5237; H01L 2251/5338
USPC ........ 257/59, 72, 88, 291, E33.056, E33.058, 257/E33.001
See application file for complete search history.

(56) References Cited

U.S. PATENT DOCUMENTS

| | | | | |
|---|---|---|---|---|
| 5,469,020 A | * | 11/1995 | Herrick ......................... | 313/511 |
| 5,923,960 A | * | 7/1999 | Harvey ......................... | 438/131 |
| 7,060,591 B2 | * | 6/2006 | Yamazaki et al. ............ | 438/457 |
| 7,132,317 B2 | * | 11/2006 | Arao .............................. | 438/154 |
| 7,420,208 B2 | * | 9/2008 | Yamazaki et al. .............. | 257/59 |
| 7,486,017 B2 | * | 2/2009 | Ohkubo ........................ | 313/506 |
| 7,501,653 B2 | * | 3/2009 | Arai et al. ........................ | 257/59 |
| 7,649,266 B2 | * | 1/2010 | Ploessl et al. ................. | 257/778 |

(Continued)

OTHER PUBLICATIONS

Choi et al. "Polymers for flexible displays: From material selection to device applications" Prog. Polym, Sci. 33 (2008) pp. 581-630.

(Continued)

*Primary Examiner* — Ida M Soward
(74) *Attorney, Agent, or Firm* — Schwabe, Williamson & Wyatt, P.C.

(57) ABSTRACT

Embodiments of the present disclosure are directed towards passivation techniques and configurations for a flexible display. In one embodiment, a flexible display includes a flexible substrate, an array of display elements configured to emit or modulate light disposed on the flexible substrate, and a passivation layer including molecules of silicon (Si) bonded with oxygen (O) or nitrogen (N), the passivation layer being disposed on the array of display elements to protect the array of display elements from environmental hazards.

26 Claims, 3 Drawing Sheets

(56) References Cited

U.S. PATENT DOCUMENTS

| | | | |
|---|---|---|---|
| 7,732,351 B2 * | 6/2010 | Oishi et al. | 438/785 |
| 7,872,263 B2 * | 1/2011 | Huang et al. | 257/66 |
| 8,530,253 B2 * | 9/2013 | Shin et al. | 438/29 |
| 8,633,474 B2 * | 1/2014 | de La Vega et al. | 257/40 |
| 2003/0173895 A1 * | 9/2003 | Kato et al. | 313/504 |
| 2004/0235227 A1 * | 11/2004 | Kawase | 438/158 |
| 2006/0278333 A1 * | 12/2006 | Lee et al. | 156/263 |
| 2008/0121725 A1 * | 5/2008 | Nomura | 235/492 |
| 2008/0224152 A1 * | 9/2008 | DiSanto et al. | 257/88 |
| 2009/0051640 A1 * | 2/2009 | Tanaka et al. | 345/92 |
| 2009/0220706 A1 * | 9/2009 | Yamazaki et al. | 427/596 |
| 2010/0026952 A1 * | 2/2010 | Miura et al. | 349/150 |
| 2010/0051325 A1 * | 3/2010 | Sato et al. | 174/254 |
| 2010/0317409 A1 * | 12/2010 | Jiang et al. | 455/566 |
| 2011/0316411 A1 * | 12/2011 | Krusos et al. | 313/484 |
| 2012/0112200 A1 * | 5/2012 | Nagano | 257/72 |
| 2014/0138637 A1 * | 5/2014 | Yang et al. | 257/40 |

OTHER PUBLICATIONS

NEC Display Solutions of America, Inc. "OLED: An emerging display technology" Jan. 2007.

* cited by examiner

PASSIVATION LAYER FOR FLEXIBLE DISPLAY

FIELD

Embodiments of the present disclosure generally relate to the field of displays, and more particularly, to passivation techniques and configurations for a flexible display.

BACKGROUND

A flexible display is an emerging type of display that is composed of flexible materials that allow the flexible display to bend or warp, for example, in arcuate shapes. A traditional hard display may employ a structurally rigid material to protect internal components of the hard display. However, materials that withstand the structural rigors associated with flexible movement may be needed to protect or passivate components for emerging flexible displays.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
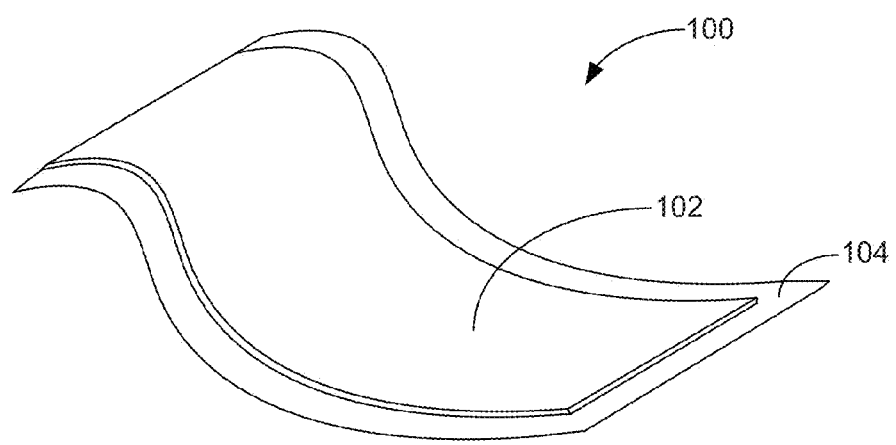
FIG. 1 schematically illustrates a flexible display assembly, in accordance with some embodiments.

Embodiments of the present disclosure describe passivation techniques and configurations for a flexible display. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a flexible display assembly 100, in accordance with some embodiments. The flexible display assembly 100 may include a flexible display 102 and housing 104 for the flexible display 102. According to various embodiments, the flexible display 102 may include a passivation layer (e.g., passivation layer 218 of FIGS. 2 and 3) as described herein.

In some embodiments, the flexible display 102 is composed of any of a wide variety of flexible, elastic materials that do not deform under strain. For example, the flexible display 102 may withstand repeated bending in arcuate shape, as depicted, or folding and return to a substantially planar shape when not under strain.

In some embodiments, the flexible display assembly 100 may include housing 104 that is flexible similar to the flexible display 102. In other embodiments, the housing 104 may be inflexible or structurally rigid. In such embodiments, the housing 104 may be configured to support the flexible display 102 in an arcuate arrangement (e.g., as depicted), a planar arrangement, or any other suitable shape of arrangement consistent with the flexibility of the flexible display 102.

In some embodiments, the housing 104 may include components for processing and displaying image information (e.g., processor 504, graphics processor 508 of FIG. 5, memory such as DRAM 510, or other components of FIG. 5) such as text, pictures, or video. The housing 104 may further include components that provide power and/or data signals for displaying image information. For example, in some embodiments, the housing 104 may be configured with a port to receive image information for display on the flexible display 102 and/or power for displaying image information. In an embodiment, the housing 104 include a battery that provides power for the flexible display 102.

In still other embodiments, the flexible display assembly 100 may not include housing 104 at all and the flexible display 102 may incorporate features described in connection with the housing 104. In some embodiments, the flexible display 102 may be part of a computing device 500 of FIG. 5 and the housing 104 may serve as housing of the computing device 500 of FIG. 5.

Figure 2:
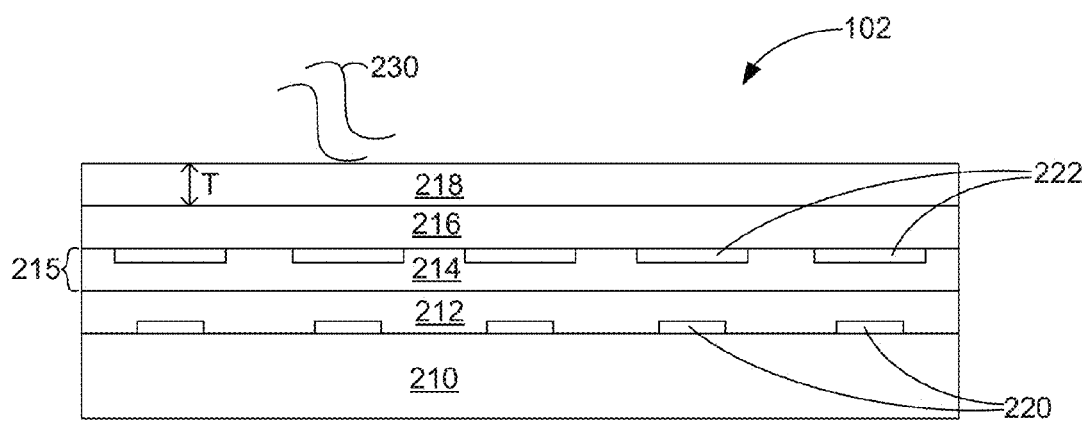
FIG. 2 schematically illustrates a cross-section view of a flexible display having a passivation layer, in accordance with some embodiments.

FIG. 2 schematically illustrates a cross-section view of a flexible display 102 having a passivation layer 218, in accordance with some embodiments. The flexible display 102 may include a flexible substrate 210, an array of thin-film transistors (TFTs) 220, an anode layer 212, an electro-optical layer 215 having an electrically conductive layer 214 and an array of display elements 222 configured to emit or modulate light, a cathode layer 216, and a passivation layer 218, coupled as can be seen.

The flexible substrate 210 may provide support for the layers disposed on the flexible substrate 210. The flexible substrate 210 may be composed of a wide variety of suitable materials. In some embodiments, the flexible substrate 210 may be composed a polymer or metal. The flexible substrate 210 may be opaque or transparent to light emitted or modulated by the display elements 222, according to various embodiments.

An array of TFTs 220 may be formed on the flexible substrate 210. The TFTs 220 may include circuitry configured to facilitate display of an image on the flexible display 102. For example, the TFTs 220 may be configured to determine, in part, which display elements 222 are turned on/off to form the image. In some embodiments, the TFTs 220 are composed of a semiconductor material such as, for example, silicon (Si).

An anode layer 212 may be formed on the flexible substrate 210. The anode layer 212 may be composed of an electrode material configured to receive electrons when current flows between the cathode layer 216 and the anode layer 212. In some embodiments, the anode layer 212 may be transparent. In some embodiments, the one or more TFTs 220 may be formed on the anode layer 212 instead of on the flexible substrate 210.

An electro-optical layer 215 may be formed on the anode layer 212. The electro-optical layer 215 may include, for example, a conductive layer 214 composed of an electrically conductive material and an array of display elements 222. In some embodiments, the display elements 222 may correspond with pixels of the flexible display 102. The display elements 222 may represent any of a wide variety of elements configured to emit or modulate light including, for example, light emitting diodes (LEDs), liquid crystal display (LCD), or electronic paper (e-paper) elements. The display elements 222 may be configured to diffuse or reflect light and may include other suitable display elements 222 in other embodiments.

A cathode layer 216 may be formed on the electro-optical layer 215. The cathode layer 216 may be composed of an electrode material configured to inject electrons when current flows between the cathode layer 216 and the anode layer 212. In some embodiments, the cathode layer 216 may be transparent.

The flexible display 102 may include a passivation layer 218 formed on the flexible substrate 210. In the depicted embodiment, the passivation layer 218 is formed on the cathode layer 216. In other embodiments, the passivation layer 218 may be formed on other layers of the flexible display 102. In one embodiment, the passivation layer 218 may provide an outermost surface (e.g., coating) of the flexible display 102 and may be in direct contact with ambient environment 230 including, for example, gas such as air, moisture, and the like.

According to various embodiments, the passivation layer 218 may be disposed on the display elements 222 and other underlying features of the flexible display 102, as can be seen, to protect the display elements 222 and the other underlying features from environmental hazards of the ambient environment 230. For example, the passivation layer 218 may be configured to protect the display elements 222 and the other underlying features from moisture, oxygen, or structural hazards that may scratch, dent, or otherwise damage the display elements 222 and the other underlying features. In some embodiments, the passivation layer 218 may be configured to provide a barrier that prevents or reduces diffusion of material to or from the TFTs 220 or the display elements 222.

In some embodiments, the passivation layer 218 may be composed of molecules of silicon (Si) bonded with oxygen (O) or nitrogen (N). For example, in some embodiments, the passivation layer 218 may be composed of silicon oxide or silicon nitride. In one embodiment, the passivation layer 218 is composed of silicon oxide including, for example, one or more of silicon monoxide (SiO) or silicon dioxide ($SiO_2$). In another embodiment, the passivation layer 218 is composed of silicon nitride including, for example, one or more of silicon mononitride (SiN), disilicon mononitride ($Si_2N$), silicon sesquinitride ($Si_2N_3$), or trisilicon tetranitride ($Si_3N_4$). The passivation layer 218 may be intrinsically doped or doped in situ with other materials such as, for example, carbon (C).

In some embodiments, the passivation layer 218 is flexible, elastic and transparent to withstand the structural rigors of repeated motion such as bending in arcuate shapes, folding, and the like. A thickness, T, of the passivation layer 218 may range from about 100 angstroms to about 100 microns in some embodiments. In other embodiments, the passivation layer 218 may be composed of other suitable materials and/or may have other thicknesses.

Figure 3:
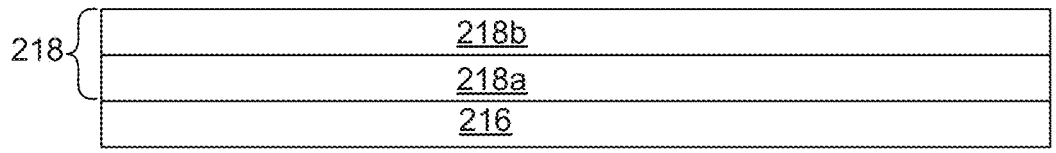
FIG. 3 schematically illustrates a cross-section view of a passivation layer having multiple layers, in accordance with some embodiments.

FIG. 3 schematically illustrates a cross-section view of a passivation layer 218 having multiple layers, in accordance with some embodiments. The passivation layer 218 may include multiple layers (e.g., sub-layers) such as, for example, a first layer 218a and a second layer 218b, as depicted.

In some embodiments, the first layer 218a may be composed of a material such as, for example, silicon oxide or silicon nitride and the second layer 218b may be composed of a material having a different chemical composition than material of the first layer 218a. For example, in one embodiment, the first layer 218a may be composed of silicon oxide and the second layer 218b may be composed of silicon nitride, or vice versa. In other embodiments, the passivation layer 218 may include three or more layers. The three or more layers may include various arrangements of different materials. In some embodiments, the three or more layers may include two different materials that alternate in material composition from layer-to-layer such as, for example, $SiO_2$/SiN/$SiO_2$/SiN.

A thicknesss and/or material for each of the multiple layers of the passivation layer 218 may be selected or tuned for desirable properties such as, for example, transparency, flexibility, elasticity, strength, barrier effect, and/or light interference. In some embodiments, one or more of the multiple layers of the passivation layer 218 may include other materials such as, for example, a polymer. The polymer may include, for example, polytetrafluoroethylene and the like. In one embodiment, the passivation layer 218 may include a first layer 218a composed of silicon oxide or silicon nitride and a second layer 218b composed of a polymer, or vice versa. In other embodiments, multiple layers of silicon nitride, silicon oxide, and/or polymer material may be arranged in various configurations to provide the passivation layer 218.

Figure 4:
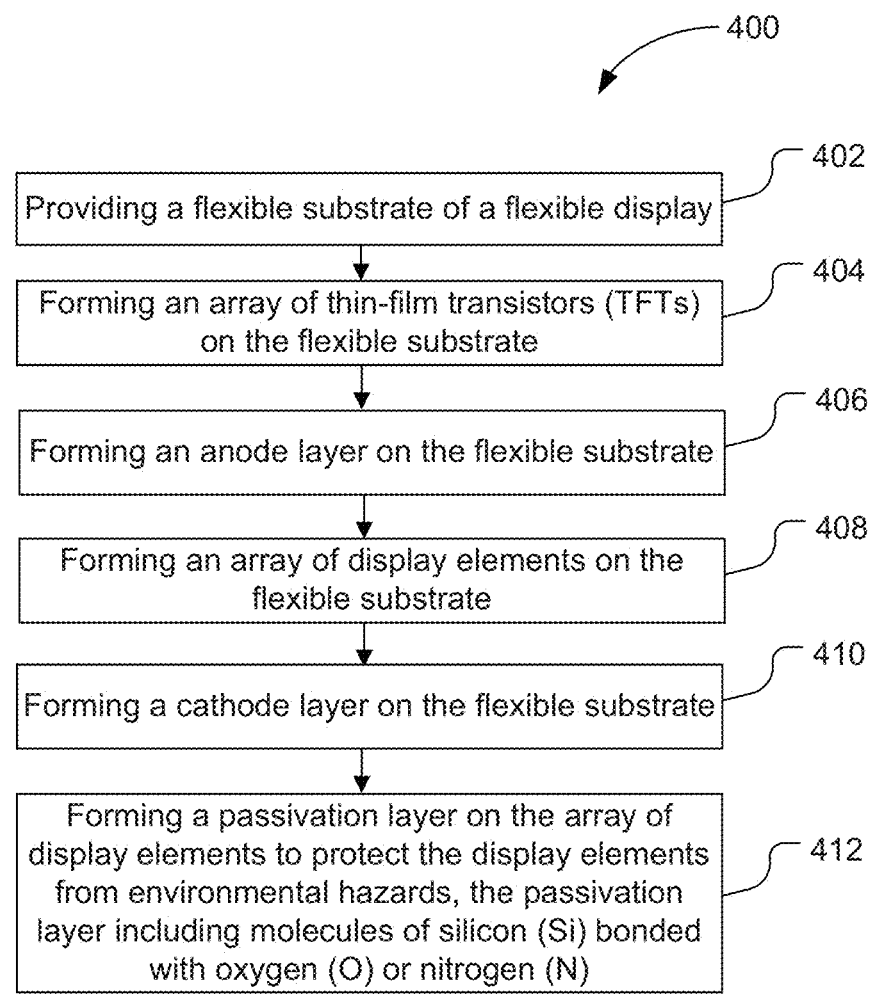
FIG. 4 schematically illustrates a flow diagram for a method of fabricating a flexible display having a passivation layer, in accordance with some embodiments.

FIG. 4 schematically illustrates a flow diagram for a method 400 of fabricating a flexible display (e.g., flexible display 102 of FIG. 2) having a passivation layer (e.g., passivation layer 218 of FIG. 1 or 2), in accordance with some embodiments. The method 400 may comport with embodiments described in connection with FIGS. 1-3 and vice versa.

At 402, the method 400 may include providing a flexible substrate (e.g., flexible substrate 210 of FIG. 2) of a flexible display. In some embodiments, the provided flexible substrate may be composed of a polymer or metal.

At 404, the method 400 may further include forming an array of thin-film transistors (TFTs) (e.g., TFTs 220 of FIG. 2). The TFTs may be formed using semiconductor fabrication techniques such as, for example, thin-film deposition, patterning processes such as lithography and/or etch, thermal processes, polishing, implant, and the like.

At 406, the method 400 may further include forming an anode layer (e.g., anode layer 212 of FIG. 2) on the flexible substrate. The anode layer may be formed by depositing an electrode material using any suitable technique. In some embodiments, the array of TFTs formed at 404 may be formed on the anode layer formed at 406.

At 408, the method 400 may further include forming an array of display elements (e.g., display elements 222 of FIG. 2) on the flexible substrate. In some embodiments, the display elements may be part of an electro-optical layer (e.g., electro-optical layer 215 of FIG. 2) formed on the anode layer. For example, an electrically conductive material may be deposited to form a conductive layer (e.g., conductive layer 214 of FIG. 2) and the display elements may be formed on the conductive layer. In other embodiments, the display elements may be formed using other suitable techniques. In some embodiments, the flexible substrate provided at 402 may include display elements formed at 408. For example, the flexible substrate provided at 402 may include LEDs, LCD elements, or e-paper elements.

At 410, the method 400 may further include forming a cathode layer (e.g., cathode layer 216 of FIG. 2) on the flexible substrate. In some embodiments, the cathode layer may be formed on the anode layer and the display elements may be disposed between the anode layer and the cathode layer (e.g., in a configuration as depicted in FIG. 2). The cathode layer may be formed by depositing an electrode material using any suitable technique.

At 412, the method 400 may further include forming a passivation layer on the array of display elements to protect the display elements from environmental hazards, the passivation layer including molecules of silicon (Si) bonded with oxygen (O) or nitrogen (N). In some embodiments, the passivation layer is formed by depositing silicon oxide or silicon nitride. The silicon oxide and/or silicon nitride may be deposited, for example, by thermal evaporation, sputtering, chemical vapor deposition (CVD), atomic layer deposition (ALD), or other suitable deposition techniques.

In some embodiments, the passivation layer may be formed by depositing multiple layers. For example, forming the passivation layer may include depositing a first layer (e.g., first layer 218a of FIG. 2) including silicon oxide or silicon nitride and depositing a second layer (e.g., second layer 218b of FIG. 2) including a material with a different chemical composition than material of the first layer. The deposition of the multiple layers may be performed to provide configurations of the multiple layers as described in connection with FIG. 3.

Materials of the passivation layer may be deposited to provide a desired thickness. In some embodiments, the thickness (e.g., thickness T of FIG. 2) may range from 100 angstroms to 100 microns. Forming the passivation layer may include forming an outermost surface coating of a flexible display. The outermost surface coating may be in direct contact with ambient gas external to the flexible display. The passivation layer may be formed to protect the array of display elements and/or the TFTs from environmental hazards or to reduce diffusion of material to or from such features.

Figure 5:
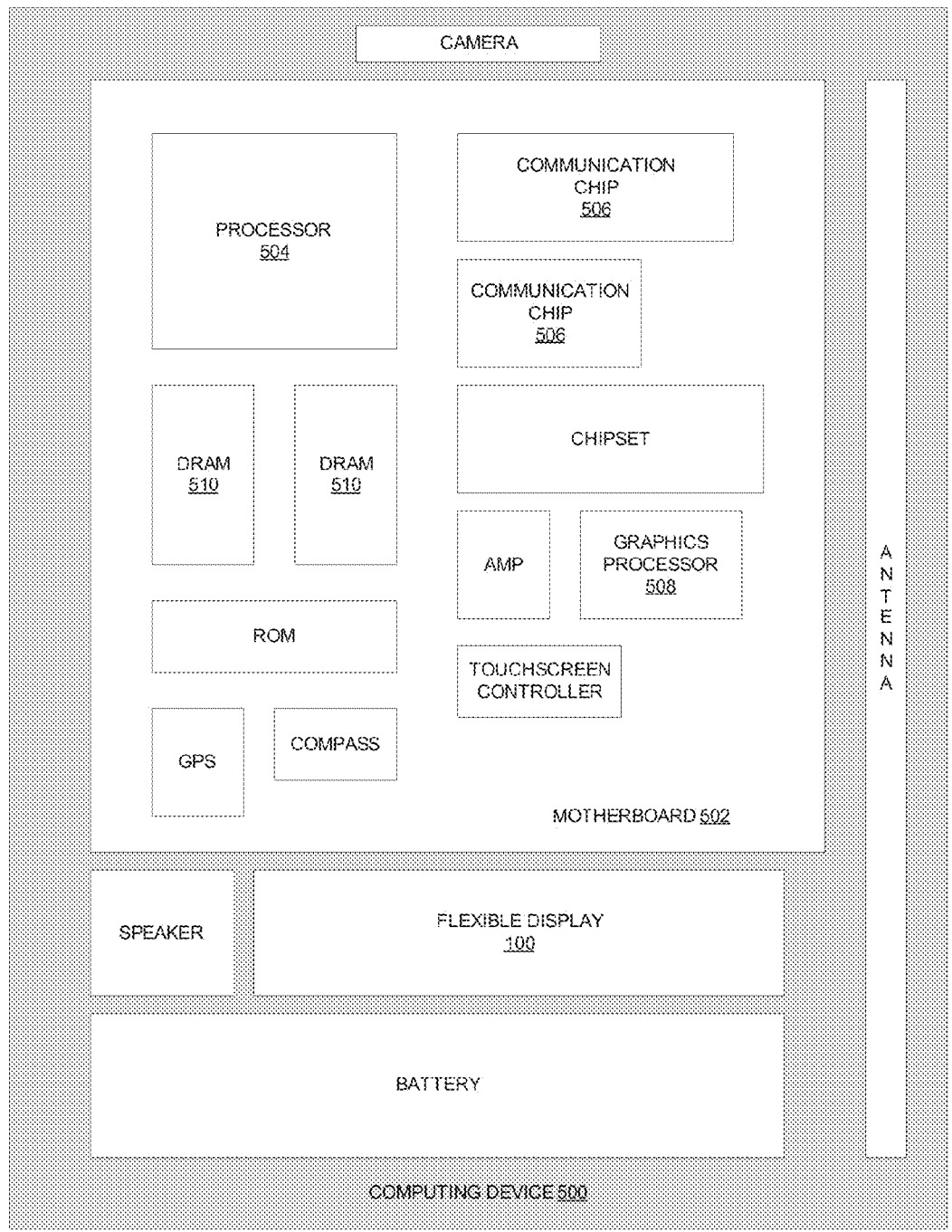
FIG. 5 schematically illustrates a computing device in accordance with one implementation of the invention.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired. FIG. 5 schematically illustrates a computing device 500 in accordance with one implementation of the invention. The computing device 500 may house a board such as motherboard 502. The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504. The term "processor" may refer to any device or portion of a device that processes electronic data from registers and/or memory to transform that electronic data into other electronic data that may be stored in registers and/or memory.

Depending on its applications, computing device 500 may include other components that may or may not be physically and electrically coupled to the motherboard 502. These other components may include, but are not limited to, volatile memory (e.g., DRAM 510), non-volatile memory (e.g., ROM), flash memory, a graphics processor 508, a digital signal processor, a crypto processor, a chipset, an antenna, a display (e.g., flexible display 100), a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The computing device 500 may include a flexible display 100 having a passivation layer (e.g., passivation layer 218 of FIGS. 2-3) as described herein. The flexible display may be coupled with a processor (e.g., processor 504 or graphics processor 508) that is configured to display images on the flexible display. In some embodiments, the computing device 500 may include multiple displays including flexible and non-flexible displays.

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A flexible display comprising:
    a flexible substrate;
    an array of display elements disposed on the flexible substrate and configured to emit or modulate light;
    a passivation layer including molecules of silicon (Si) bonded with oxygen (O) or nitrogen (N), the passivation layer being disposed on the array of display elements to protect the array of display elements from environmental hazards;
    an anode layer disposed on the flexible substrate; and
    a cathode layer disposed on the anode layer, wherein the array of display elements are disposed between the anode layer and the cathode layer.

2. The flexible display of claim 1, wherein the flexible substrate comprises a polymer or metal.

3. The flexible display of claim 1, wherein the passivation layer comprises silicon oxide or silicon nitride.

4. The flexible display of claim 3, wherein the passivation layer comprises silicon mononitride (SiN), disilicon mononitride ($Si_2N$), silicon sesquinitride ($Si_2N_3$), or trisilicon tetranitride ($Si_3N_4$).

5. The flexible display of claim 3, wherein the passivation layer comprises silicon monoxide (SiO) or silicon dioxide ($SiO_2$).

6. The flexible display of claim 1, wherein the passivation layer comprises multiple sub-layers including a first sub-layer including silicon oxide or silicon nitride and a second sub-layer including a material having a different chemical composition than material of the first sub-layer.

7. The flexible display of claim 6, wherein the second sub-layer comprises polytetrafluoroethylene.

8. The flexible display of claim 1, wherein the passivation layer:
    is doped with a material other than Si, O, or N;
    is flexible and transparent; and
    has a thickness ranging from 100 angstroms to 100 microns.

9. The flexible display of claim 1, wherein the passivation layer is an outermost surface coating of the flexible display in direct contact with ambient gas external to the flexible display.

10. The flexible display of claim 1, wherein the array of display elements comprise light emitting diodes (LEDs), electronic paper elements, or liquid crystal display (LCD) elements.

11. The flexible display of claim 1, further comprising:
    an array of thin-film transistors (TFTs) disposed on the flexible substrate, wherein the passivation layer is configured to reduce diffusion of material to or from the TFTs.

12. A method comprising:
    providing a flexible substrate having an array of display elements configured to emit or modulate light disposed on the flexible substrate;
    forming a passivation layer on the array of display elements to protect the array of display elements from environmental hazards, the passivation layer including molecules of silicon (Si) bonded with oxygen (O) or nitrogen (N);
    forming an anode layer on the flexible substrate; and forming a cathode layer on the anode layer, wherein the array of display elements are disposed between the anode layer and the cathode layer.

13. The method of claim 12, wherein providing a flexible substrate comprises providing a flexible substrate including a polymer or metal.

14. The method of claim 12, wherein forming the passivation layer comprises depositing silicon oxide or silicon nitride.

15. The method of claim 14, wherein forming the passivation layer comprises depositing the silicon oxide or the silicon nitride using thermal evaporation, sputtering, chemical vapor deposition (CVD), or atomic layer deposition (ALD).

16. The method of claim 14, wherein forming the passivation layer comprises depositing silicon mononitride (SiN), disilicon mononitride ($Si_2N$), silicon sesquinitride ($Si_2N_3$), or trisilicon tetranitride ($Si_3N_4$).

17. The method of claim 14, wherein forming the passivation layer comprises depositing silicon monoxide (SiO) or silicon dioxide ($SiO_2$).

18. The method of claim 12, wherein forming the passivation layer comprises depositing multiple layers including:
    depositing a first layer including silicon oxide or silicon nitride; and
    depositing a second layer including a material having a different chemical composition than material of the first layer.

19. The method of claim 18, wherein depositing the second layer comprises depositing polytetrafluoroethylene.

20. The method of claim 12, wherein forming the passivation layer comprises depositing material to provide a passivation layer having a thickness ranging from 100 angstroms to 100 microns.

21. The method of claim 12, wherein forming the passivation layer comprises forming an outermost surface coating of a flexible display, the passivation layer being in direct contact with ambient gas external to the flexible display.

22. The method of claim 12, wherein providing the flexible substrate comprises providing a flexible substrate having an array of display elements including light emitting diodes (LEDs), electronic paper elements, or liquid crystal display (LCD) elements, the method further comprising:
    forming an array of thin-film transistors (TFTs) on the flexible substrate, wherein the passivation layer is configured to reduce diffusion of material to or from the TFTs.

23. A flexible display comprising:
    a flexible substrate;
    an array of display elements disposed on the flexible substrate and configured to emit or modulate light; and
    a passivation layer including molecules of silicon (Si) bonded with oxygen (O) or nitrogen (N), the passivation layer being disposed on the array of display elements to protect the array of display elements from environmental hazards, wherein the passivation layer comprises multiple sub-layers including a first sub-layer including silicon oxide or silicon nitride and a second sub-layer including a material having a different chemical composition than material of the first sub-layer.

24. The flexible display of claim 23, wherein the second sub-layer comprises polytetrafluoroethylene.

25. A flexible display comprising:
    a flexible substrate;
    an array of display elements disposed on the flexible substrate and configured to emit or modulate light; and
    a passivation layer including molecules of silicon (Si) bonded with oxygen (O) or nitrogen (N), the passivation layer being disposed on the array of display elements to protect the array of display elements from environmental hazards, wherein the passivation layer is doped with a material other than Si, O, or N, is flexible and transparent and has a thickness ranging from 100 angstroms to 100 microns.

26. The flexible display of claim 25, wherein the passivation layer is an outermost surface coating of the flexible display in direct contact with ambient gas external to the flexible display.

* * * * *